(12) United States Patent
Murata et al.

(10) Patent No.: US 9,370,115 B2
(45) Date of Patent: Jun. 14, 2016

(54) PLC UNIT

(71) Applicant: Mitsubishi Electric Corporation, Tokyo (JP)

(72) Inventors: Yoshikazu Murata, Tokyo (JP); Takanori Miyake, Tokyo (JP); Yuta Yamada, Tokyo (JP); Kenichi Shimodaira, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/429,468

(22) PCT Filed: Nov. 12, 2012

(86) PCT No.: PCT/JP2012/079290
§ 371 (c)(1),
(2) Date: Mar. 19, 2015

(87) PCT Pub. No.: WO2014/073112
PCT Pub. Date: May 15, 2014

(65) Prior Publication Data
US 2015/0257294 A1    Sep. 10, 2015

(51) Int. Cl.
*H05K 5/02* (2006.01)
*H05K 7/14* (2006.01)
(Continued)

(52) U.S. Cl.
CPC .............. *H05K 5/0247* (2013.01); *G05B 19/05* (2013.01); *G06F 1/181* (2013.01); *H05K 5/0217* (2013.01); *H05K 5/03* (2013.01); *H05K 7/1462* (2013.01)

(58) Field of Classification Search
CPC .......... H05K 5/0247; G06F 1/181; G06F 5/03
USPC .................... 361/679.01, 729, 686
See application file for complete search history.

(56) References Cited

U.S. PATENT DOCUMENTS 4,920,453 A * 4/1990 Onose .................. H05K 7/1469
361/679.21
5,455,744 A   10/1995 Watanabe
(Continued)

FOREIGN PATENT DOCUMENTS

JP    60-158745 U    10/1985
JP    64-044671 U    3/1989
(Continued)

OTHER PUBLICATIONS

JP Office Action for JP 2013-513889 dated Jul. 9, 2013.
(Continued)

*Primary Examiner* — Tuan T Dinh
*Assistant Examiner* — Rockshana Chowdhury
(74) *Attorney, Agent, or Firm* — Sughrue Mion, PLLC; Richard C. Turner (57) ABSTRACT

A PLC unit comprises a control unit that includes a first surface of a substantially rectangular shape, where a unit-side connector is provided on a second surface that is a back surface side of the first surface, a base that includes a fixing surface having a base-side connector connected to the unit-side connector provided thereon, where a plurality of the control units are fixed on the fixing surface side by side in a lateral direction of the first surface, and a duct that is provided along a side part of the control unit on a longitudinal direction side of the first surface so as to be closer to the base side, wherein at least a part of the first surface of the control unit is constituted by a cover which is rotatably supported about an axis substantially parallel to the lateral direction of the first surface, and is openable in an area opposite to the base.

5 Claims, 8 Drawing Sheets (51) Int. Cl.
*G05B 19/05* (2006.01)
*G06F 1/18* (2006.01)
*H05K 5/03* (2006.01)

(56) References Cited

U.S. PATENT DOCUMENTS

| | | | | |
|---|---|---|---|---|
| 5,541,810 | A * | 7/1996 | Donhauser | G05B 19/054 361/679.41 |
| 6,008,985 | A * | 12/1999 | Lake | G05B 19/0423 361/679.32 |
| 6,052,278 | A * | 4/2000 | Tanzer | G11B 33/128 312/223.3 |
| 6,172,875 | B1 * | 1/2001 | Suzuki | G06F 1/183 361/679.4 |
| 6,952,341 | B2 | 10/2005 | Hidaka et al. | |
| 2009/0239460 | A1 * | 9/2009 | Lucia | H05K 7/20745 454/184 |
| 2010/0144265 | A1 * | 6/2010 | Bednarcik | H05K 7/20745 454/184 |
| 2011/0320016 | A1 * | 12/2011 | Sugimoto | G05B 19/042 700/19 |

FOREIGN PATENT DOCUMENTS

| | | |
|---|---|---|
| JP | 01-189703 A | 7/1989 |
| JP | 05-025504 U | 4/1993 |
| JP | 06-023282 U | 3/1994 |
| JP | 06-337706 A | 12/1994 |
| JP | 07-032778 U | 6/1995 |
| JP | 09-275359 A | 10/1997 |
| JP | 10-078806 A | 3/1998 |
| JP | 2000-181511 A | 6/2000 |
| JP | 2000-183558 A | 6/2000 |
| JP | 2001-034310 A | 2/2001 |
| JP | 2001-044662 A | 2/2001 |
| JP | 2003-005810 A | 1/2003 |
| JP | 2004-054967 A | 2/2004 |
| JP | 2004-208369 A | 7/2004 |
| JP | 2004-303880 A | 10/2004 |

OTHER PUBLICATIONS

JP Office Action for JP 2013-513889 dated Oct. 1, 2013.
International Search Report for PCT/JP2012/079290 dated Jan. 15, 2013.
Communication dated Feb. 2, 2016 from the Korean Intellectual Property Office issued in corresponding Application No. 10-2015-7008467, 5 pages.
Communication dated Mar. 31, 2016 from the German Patent and Trademark Office in counterpart application No. 112012006811.4, 6 pages.

* cited by examiner

PLC UNIT

CROSS REFERENCE TO RELATED APPLICATIONS

This application is a National Stage of International Application No. PCT/JP2012/079290 filed Nov. 12, 2012, the contents of all of which are incorporated herein by reference in their entirety.

FIELD

The present invention relates to a PLC unit in which a plurality of control units are arranged side by side.

BACKGROUND

A PLC (Programmable Logic Controller) unit in which a plurality of control units are fixed on a base has been conventionally used for a part of a system or the like constituted by FA devices. The front surface side of each control unit has a substantially rectangular shape when viewed from the front, and the control unit is fixed on the base such that the longitudinal direction thereof is made to be a vertical direction. The control units are fixed on the base side by side in the horizontal direction (the lateral direction of the rectangular shape of the front surface side).

Cables such as power supply lines are sometimes connected to the front surface of the control units. Among those control units, the one whose front surface is covered with a cover designated to open and close is disclosed in, for example, Patent Literature 1.

CITATION LIST

Patent Literature

Patent Literature 1: Japanese Patent Application Laid-open No. 2001-34310

SUMMARY

Technical Problem

However, according to the conventional technique described above, a cover that covers the front surface side of a control unit is rotatable about an axis that is substantially parallel to the longitudinal direction of the rectangular shape of the front surface, and is arranged to be openable either to the left or right direction. Because the control units are arranged on a base side by side in the horizontal direction, in a state in which the control units are fixed on the base side by side, adjacent control units interfere with each other, and accordingly the covers may not be fully opened. As the covers cannot be fully opened, there is a problem in that work efficiency of cable connections and the like is deteriorated.

The cover is arranged to be opened either to the left or right direction. Accordingly, a finger hooking part used for opening the cover is provided either on the left or right side. When the finger hooking part is provided on the left side of the cover, operability by a right hand is degraded, and when the finger hooking part is provided on the right side thereof, operability by a left hand is degraded. Accordingly, there is a problem in that a deflection occurs in operability of opening and closing the covers.

The present invention has been achieved in view of the above problems, and an object of the invention is to provide a PLC unit in which covers of the control units are opened with substantial ease without being blocked by adjacent control units.

Solution to Problem

In order to solve the aforementioned problems, a PLC unit according to one aspect of the present invention is constructed to include: a control unit that includes a first surface of a substantially rectangular shape, and is provided with a unit-side connector on a second surface that is a back surface of the first surface; a base that includes a fixing surface on which a base-side connector connected to the unit-side connector is provided, and on which a plurality of the control units are fixed side by side in a lateral direction of the first surface; and a duct that is provided at a side portion of the control unit which is on the longitudinal direction side of the first surface so as to be formed closer to the base side, wherein at least one part of the first surface of the control unit is constituted by a cover, which is rotatably supported about an axis substantially parallel to the lateral direction of the first surface, and is made openable in an area that is opposite to the base with respect to the duct as a movable area.

Advantageous Effects of Invention

In the PLC unit according to the present invention, covers of the control units are opened with substantial ease without being blocked by an adjacent control unit.

DESCRIPTION OF EMBODIMENTS

Exemplary embodiments of a PLC unit according to the present invention will be explained below in detail with reference to the accompanying drawings. The present invention is not limited to the embodiments.

First Embodiment

Figure 1:
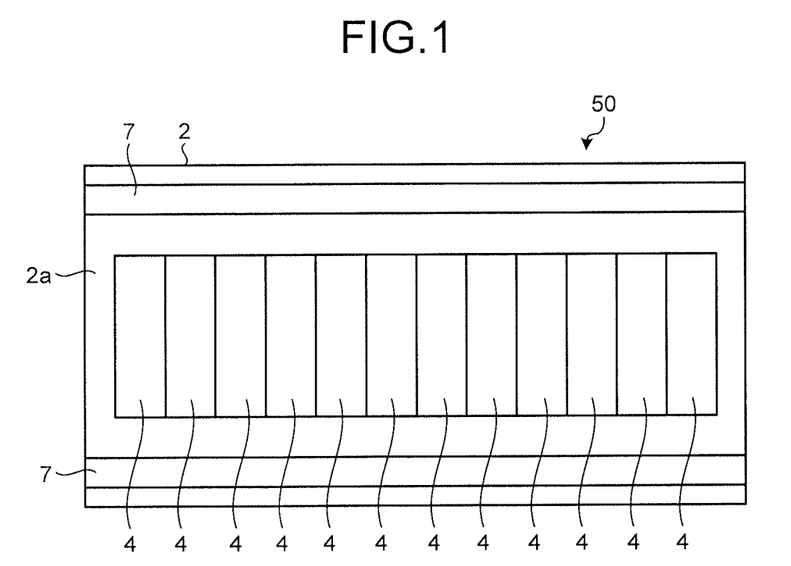
FIG. 1 is a front view of a schematic configuration of a PLC unit according to a first embodiment of the present invention.
Figure 2:
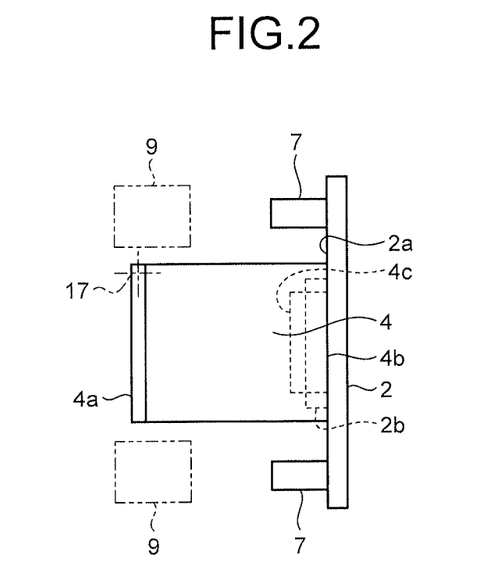
FIG. 2 is a side view of the PLC unit shown in FIG. 1.

FIG. 1 is a front view of a schematic configuration of a PLC unit according to the first embodiment of the present invention. FIG. 2 is a side view of the PLC unit shown in FIG. 1. PLC unit 50 includes a base 2, control units 4, and a duct 7. In the base 2, a plurality of connectors (base-side connectors 2b) are provided on a fixing surface 2a. A plurality of the control units 4 are fixed on the fixing surface 2a side by side. Detailed explanations of a configuration and a mechanism of fixing the control units 4 on the fixing surface 2a will be omitted.

Figure 3:
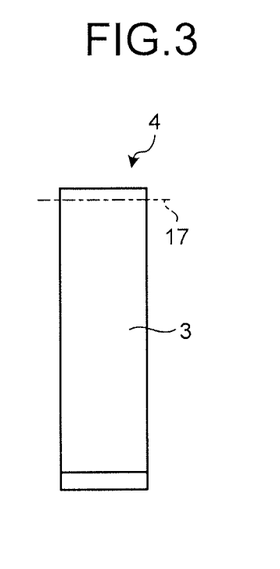
FIG. 3 is a front view of a control unit.
Figure 4:
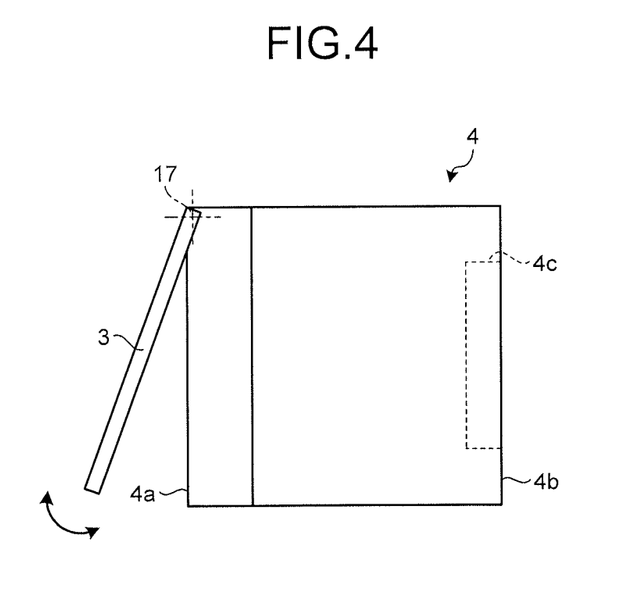
FIG. 4 is a side view of the control unit.

FIG. 3 is a front view of the control unit 4. FIG. 4 is a side view of the control unit 4. The front surface (first surface) 4a side of the control unit 4 is covered with a cover 3, and on the rear surface (second surface) 4b, which is a back surface side of the front surface 4a, a connector (a unit-side connector 4c) that can be connected to the base-side connector 2b is provided.

The front surface 4a of the control unit 4 has a substantially rectangular shape. The control unit 4 is fixed on the base 2 such that the unit-side connector 4c is connected to the base-side connector 2b. The plurality of control units 4 are fixed on the base 2 such that they are arranged side by side in a lateral direction of the front surface 4a. In the following explanations, the lateral direction of the front surface 4a is also referred to as a horizontal direction, and the longitudinal direction of the front surface 4a is also referred to as a vertical direction.

The cover 3 is rotatably supported by the control unit 4 so as to rotate about a rotating axis 17 that extends in the horizontal direction substantially parallel to the lateral direction of the front surface 4a and is openable in the vertical direction. In the present embodiment, the rotating axis 17 is provided at an upper end of the control unit 4, and the cover 3 can be opened by hooking fingers on a lower end of the cover 3 and lifting up the lower end. Accordingly, deflection of operability in opening the cover 3 is hardly caused between a case where the cover 3 is opened with a left hand and a case where the cover 3 is opened with a right hand.

The duct 7 is provided at a side part of the control unit 4, which is in the longitudinal direction of the front surface 4a of the control unit 4, that is arranged on the upper or lower part of the control unit 4. The duct 7 is fixed on the base 2. Accordingly, the duct 7 is arranged at a position closer to the rear surface 4b side of the control unit 4, that is, a position closer to the base 2 side. A control cable and a power supply cable are drawn around the duct 7, and these cables are connected to the front surface 4a side of the control unit 4 where the cover 3 is open.

The duct 7 is arranged at a position closer to the base 2 side. Accordingly, an obstacle-free area 9 is formed in front of the duct 7 as shown in FIG. 2. That is, the obstacle-free area 9 is formed in areas above and below the control unit 4, rather in the forward direction. The cover 3 of the control unit 4 is configured to be lifted up when it is opened. Accordingly, the cover 3 can be rotated up to the above-mentioned obstacle-free area 9, so that the cover 3 is opened with substantial ease.

As a result, the cover 3 hardly blocks cable connection works and the work efficiency of the cable connections and the like can be improved. On the other hand, if the rotating axis of the cover extends vertically and the cover 3 is opened in the horizontal direction, the cover 3 may interfere with a control unit 4 adjacent thereto and may not be fully opened.

Figure 5:
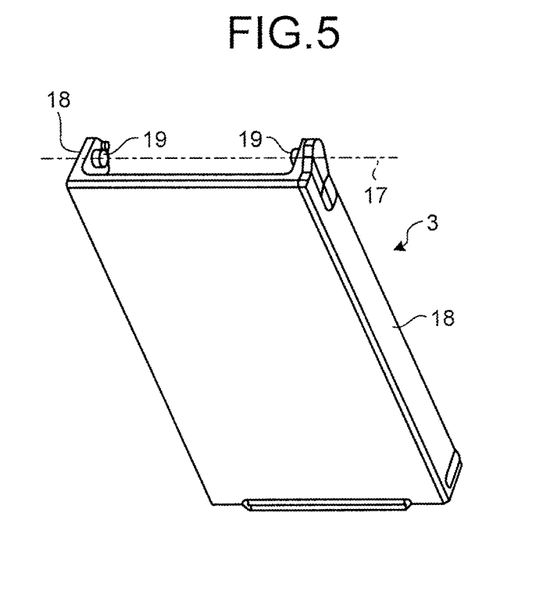
FIG. 5 is a perspective view of a cover.
Figure 6:
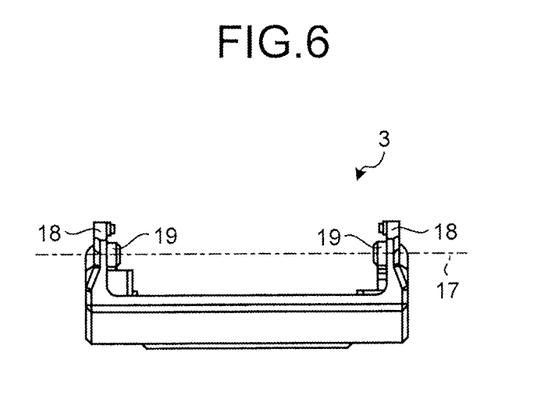
FIG. 6 shows a cover as viewed from above.

FIG. 5 is a perspective view of the cover 3. FIG. 6 shows the cover 3 when viewed from above. A rear-surface extending part (extending part) 18 extending toward its rear surface side is provided on both side parts of the cover 3. An inward protruding part (protruding part) 19 protruding from one of the rear-surface extending parts 18 toward the other rear-surface extending part 18 is formed to be substantially parallel to the rotating axis 17.

By fitting the inward protruding parts 19 into hollow parts (not shown) formed in the side parts of the control unit 4, the cover 3 can be firmly attached to the control unit 4. Accordingly, the cover 3 is rotatably supported by the control unit 4 so as to rotate about the inward protruding parts 19. That is, a line connecting the inward protruding parts 19 to each other overlaps the rotating axis 17.

When the cover 3 is attached to the control unit 4, the rear-surface extending parts 18 need to be bent outward in order that each of the inward protruding parts 19 is fitted into a hollow part of the control unit 4. In the present embodiment, the portion around a part of the rear-surface extending part 18 overlapping the rotating axis 17 is formed to be thinner than other portions. With this configuration, the part of the rear-surface extending parts 18 each having the inward protruding part 19 formed thereon can be bent easily. As a result, it is made possible to omit the formation of slits each for easily bending the rear-surface extending part 18. Accordingly, larger characters and symbols can be printed on the front surface side of the cover 3, and it becomes easy to reliably inform a user of warnings and alerts. A wider range of the rear-surface extending part 18 can be formed thinner than those in the example shown in FIGS. 5 and 6, or the overall rear-surface extending part 18 can be formed thinner.

The portion around the part of the rear-surface extending part 18 overlapping the rotating axis 17 is bent to be formed more inwardly than the left and right ends of the cover 3. For this reason, when the part of the rear-surface extending part 18 having the inward protruding part 19 formed thereon is bent outwardly, the rear-surface extending part 18 hardly protrudes outwardly further than the left and right ends of the cover 3. In a case in which one control unit 4 is fixed on the base 2, that is, another control unit 4 is adjacent to the one control unit without any gap therebetween, if the rear-surface extending part 18 protrudes outwardly further than the left and right ends of the cover 3, the rear-surface extending part 18 interferes with the another control unit 4 adjacent thereto, so that attachment and removal of the cover 3 become difficult. On the other hand, in the present embodiment, because the rear-surface extending part 18 hardly protrudes further outwardly than the left and right ends of the cover 3, such a problem hardly occurs. Note that a wider range of the rear-surface extending part 18 than those in the example shown in FIGS. 5 and 6 can be bent to be formed more inwardly than the left and right ends of the cover 3, or the entire rear-surface extending part 18 can be bent to be formed more inwardly than the left and right ends of the cover 3.

Figure 7:
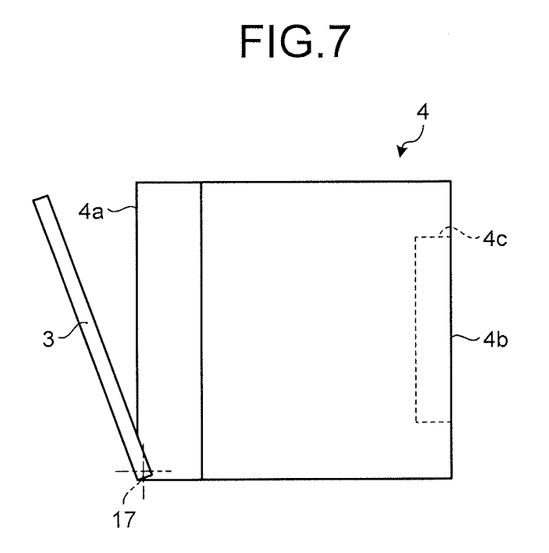
FIG. 7 is a side view of a first modification of the control unit.

FIG. 7 is a side view of a first modification of the control unit 4. As shown in FIG. 7, it is also possible to provide the rotating axis 17 at a lower part of the control unit 4. In this case, the cover 3 can be opened by hooking fingers on an upper end of the cover 3 and drawing down the upper end. As shown in FIG. 2, there is an obstacle-free area also below the control unit 4 and the cover 3 can be opened up to this area, so that the cover 3 can be sufficiently opened with ease. Accordingly, the cover 3 hardly blocks cable connection works, and the work efficiency of the cable connection works and the like can be improved.

Figure 8:
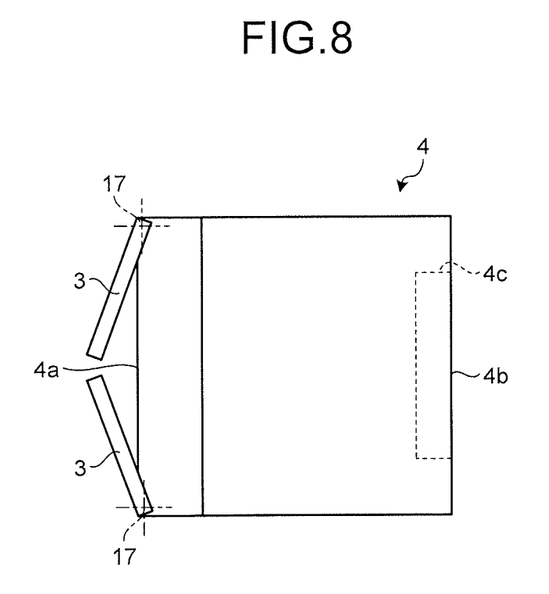
FIG. 8 is a side view of a second modification of the control unit.

FIG. 8 is a side view of a second modification of the control unit 4. As shown in FIG. 8, it is also possible that the cover 3 is divided into an upper cover and a lower cover and the respective covers are rotatably supported about the rotating axes 17 at the upper part and the lower part of the control unit 4. With such a configuration, the cover 3 can be opened and closed in a more compact area. Accordingly, even if the height level of the area 9 is small, the cover 3 can be sufficiently opened with ease. Further, it is also possible to open only either one of the upper cover 3 and the lower cover 3, which is necessary to be opened.

Figure 9:
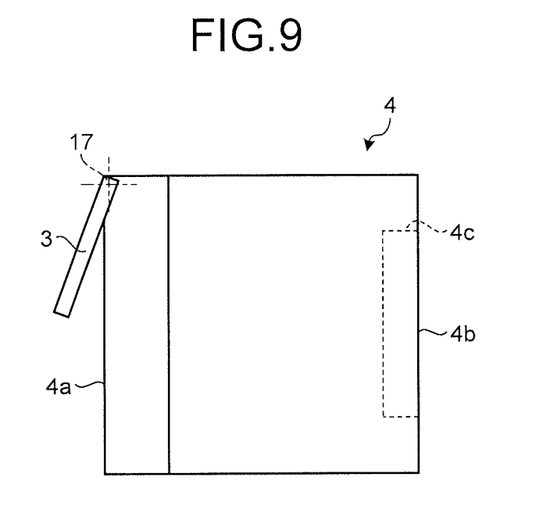
FIG. 9 is a side view of a third modification of the control unit.
Figure 10:
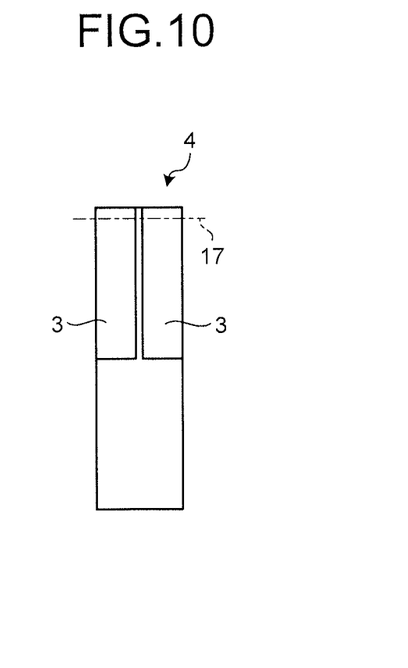
FIG. 10 is a front view of the control unit shown in FIG. 9.

FIG. 9 is a side view of a third modification of the control unit 4. FIG. 10 is a front view of the control unit 4 shown in FIG. 9. In the third modification, the cover 3 is further divided into a left cover and a right cover. While FIGS. 9 and 10 show a state in which only the cover 3 that covers the upper part of the front surface 4a of the control unit 4 is provided, it is needless to mention that the other cover 3 that covers the lower part of the front surface 4a is provided. Both the upper cover 3 and the lower cover 3 can be divided respectively into a left cover and a right cover, or only either the upper cover 3 or the lower cover 3 can be divided into a left cover and a right cover. The number of divisions is not limited to two, but can be equal to or larger than three.

Figure 11:
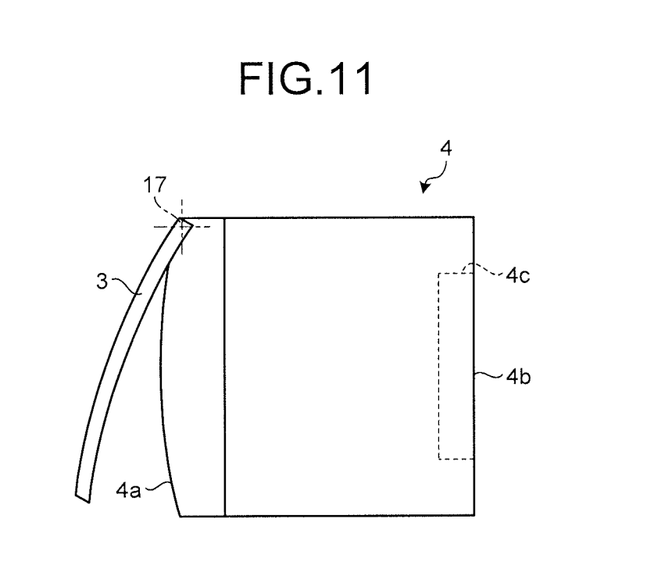
FIG. 11 is a side view of a fourth modification of the control unit.

FIG. 11 is a side view of a fourth modification of the control unit 4. As shown in FIG. 11, a front surface side of the cover 3 can be formed to be a curved surface. With this configuration, the area of the front surface side of the cover 3 becomes larger than the case in which the front surface side of the cover 3 is flat. Accordingly, larger characters and symbols can be printed on the front side of the cover 3, and it becomes easy to reliably inform a user of warnings and alerts.

Figure 12:
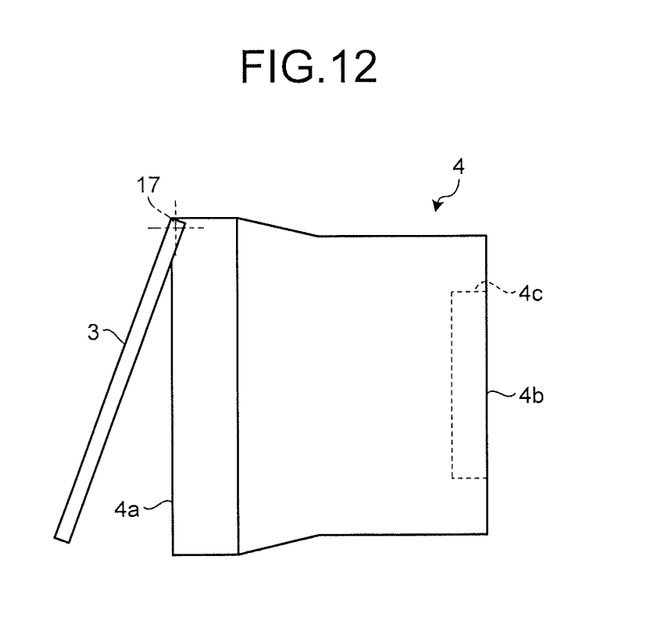
FIG. 12 is a side view of a fifth modification of the control unit.
Figure 13:
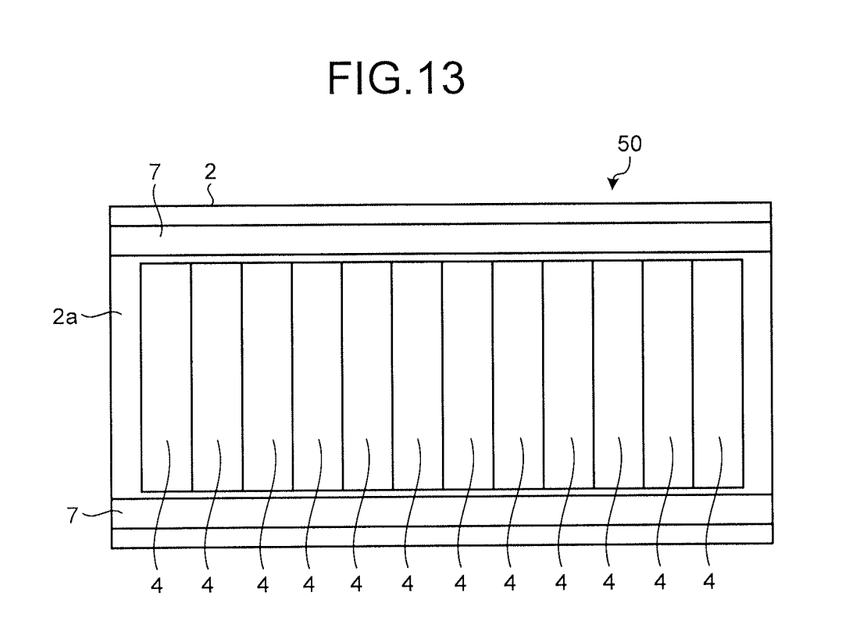
FIG. 13 is a front view of a PLC unit including the control unit shown in FIG. 12.
Figure 14:
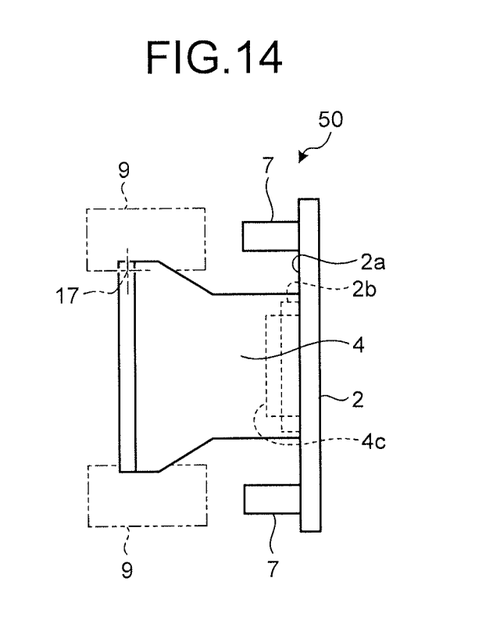
FIG. 14 is a side view of the PLC unit including the control unit shown in FIG. 12.

FIG. 12 is a side view of a fifth modification of the control unit 4. FIG. 13 is a front view of the PLC unit 50 including a plurality of the control units 4 shown in FIG. 12. FIG. 14 is a side view of the PLC unit 50 including the control unit 4 shown in FIG. 12.

As shown in FIG. 12, it is also possible that the size of the control unit 4 in the vertical direction (the size of the front surface 4a in the longitudinal direction) is set such that the size of the front surface 4a side is larger than that of the rear surface 4b side. With such a configuration, as shown in FIG. 14, the area 9 present in the forward direction of the duct 7 can also be used as an installation space for the control unit 4. Therefore, the space can be effectively used. Further, the area of the front surface side of the cover 3 can be further increased. As a result, larger characters and symbols can be printed on the front side of the cover 3, and it becomes easy to reliably inform a user of warnings and alerts.

Figure 15:
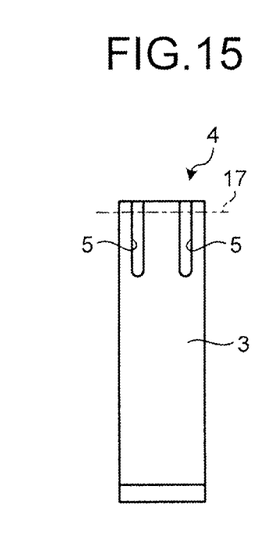
FIG. 15 is a front view of a sixth modification of the control unit.

FIG. 15 is a front view of a sixth modification of the control unit 4. As shown in FIG. 15, it is also possible to form slits 5 that extend to be substantially vertical to the rotating axis 17 from the upper end of the cover 3 where the rotating axis 17 is provided. Accordingly, the rear-surface extending parts 18 (see also FIGS. 5 and 6) of the cover 3 are made more easily bent and attachment and removal of the cover 3 are also made easy.

REFERENCE SIGNS LIST 2 base, 2a fixing surface, 2b base-side connector, 3 cover, 4 control unit, 4a front surface (first surface), 4b rear surface (second surface), 4c unit-side connector, 5 slit, 7 duct, 9 area, 17 rotating axis, 18 rear-surface extending part (extending part), 19 inward protruding part (protruding part), 50 PLC unit.

The invention claimed is:

1. A PLC unit comprising:
   a base that includes a fixing surface on which a base-side connector is provided, and on which a plurality of control units are fixed side by side in a lateral direction; and
   a duct that is provided on the base in at least one of an upper side and a lower side of the plurality of control units, in a longitudinal direction perpendicular to the lateral direction,
   wherein a control unit of the plurality of control units includes a first surface of a substantially rectangular shape, and a unit-side connector which is disposed on a second surface disposed opposite the first surface and connected to the base-side connector,
   the duct is disposed substantially closer to the base than to the first surface, as seen in a depth direction which is orthogonal to the lateral and longitudinal directions and extends between the first surface and the second surface,
   at least a part of the first surface is constituted by a cover, which is rotatably supported about an axis substantially parallel to the lateral direction, and is made openable in an area that is disposed between the duct and a plane of the first surface, as seen in the depth direction, and
   the cover is divided into a first cover that is opened toward the upper side and a second cover that is opened toward the lower side, in the longitudinal direction.

2. The PLC unit according to claim 1, wherein in the cover, the first surface is formed to be a curved surface.

3. The PLC unit according to claim 1, wherein a size of the control unit along the first surface is larger than a size of the control unit along the second surface, in the longitudinal direction.

4. The PLC unit according to claim 1, wherein
   the cover is formed with extending parts that extend from both ends of the cover on a lateral-direction side of the first surface toward the second surface and protruding parts that protrude from the extending part toward the other extending part so as to be substantially parallel to the axis, and
   at least a portion around a part of each of the extending parts overlapping the axis is formed more inwardly than the both ends of the cover along the lateral direction.

5. The PLC unit according to claim 1, wherein the area, into which the cover is openable, is a free space between the duct and the control unit.

* * * * *